(12) United States Patent
Shih

(10) Patent No.: US 7,114,122 B2
(45) Date of Patent: Sep. 26, 2006

(54) BRANCH METRIC GENERATOR FOR VITERBI DECODER

(75) Inventor: Ying-Heng Shih, Pingtung (TW)

(73) Assignee: Benq Corporation, Taoyuan (TW)

( * ) Notice: Subject to any disclaimer, the term of this patent is extended or adjusted under 35 U.S.C. 154(b) by 539 days.

(21) Appl. No.: 10/690,369

(22) Filed: Oct. 21, 2003

(65) Prior Publication Data

US 2004/0081250 A1    Apr. 29, 2004

(30) Foreign Application Priority Data

Oct. 25, 2002    (TW) ............................... 91124965 A

(51) Int. Cl.
*H03M 13/23*    (2006.01)
*H03M 13/25*    (2006.01)

(52) U.S. Cl. .................. 714/795; 714/792; 714/794
(58) Field of Classification Search ............... 714/792, 714/794–795; H03M 13/23, 13/25
See application file for complete search history.

(56) References Cited

U.S. PATENT DOCUMENTS 4,583,078 A    4/1986    Shenoy et al.
5,912,908 A    6/1999    Cesari et al.
5,970,104 A    10/1999    Zhong et al.
6,061,823 A *    5/2000    Nara ........................... 714/794
6,092,234 A *    7/2000    Azakami et al. ............ 714/789

OTHER PUBLICATIONS

Abramovici, M., et al.; Digital Systems Testing and Testable Design; IEEE Press, Piscataway, New Jersey, 1994, pp. 432-439.

* cited by examiner

*Primary Examiner*—R. Stephen Dildine
(74) *Attorney, Agent, or Firm*—Snell & Wilmer L.L.P

(57) ABSTRACT

The present invention discloses an apparatus used to generate a branch metric for a Viterbi decoder. The apparatus includes a linear feedback shift register and a convolutional encoder. The linear feedback shift register performs a calculation based on a specific primitive characteristic polynomial and creates a binary number sequence after the calculation. The convolutional encoder generates the branch metric by encoding the binary number sequence. Besides, the apparatus is further capable of selecting one of the several built-in primitive characteristic polynomials by inputting a selection signal in order to conform to the request of the different systems.

12 Claims, 7 Drawing Sheets

BRANCH METRIC GENERATOR FOR VITERBI DECODER

CROSS REFERENCE TO RELATED APPLICATION

This Application claims priority to Taiwan Patent Application No. 091124965 filed on Oct. 25, 2002.

FIELD OF INVENTION

This invention relates generally to a branch metric generator and, more specifically, relates to a branch metric generator for Viterbi decoder that generates branch metrics applied in WCDMA, wireless LAN and other digital communication systems.

BACKGROUND OF THE INVENTION

Heretofore, it is known that the convolutional encoding and error correction technologies are applied frequently in the receiving ends of the wireless communications.

The processes include the steps of decoding of the encoded signals and converting the signals into readable data. Viterbi decoders are a kind of popular convolutional decoder, calculating the received signals based on the built-in parameters and tracing possible routes to restore the original data.

Referring to FIG. 1, a Viterbi decoder includes three major portions: a branch metric generation unit (BMU), a path metric uploading unit (PMU) and a survivor memory management unit (SMU). The BMU calculates and generates a branch metric 101 based on input signals IN. The PMU carries out a comparison and generates new branch route 103. The SMU decodes and outputs correct data OUT through the branch route 103.

The branch metric 101 is the tracks during encoding. FIG. 2 illustrates a trellis diagram of a convolutional encoder. Column 201 shows that a branch metric with a length of 8 can have $2^{8-1}=128$ states (0~127). Row 203 indicates the input bits (Bit0~BitN) of the encoder. State 205 indicates the current status of the encoder. It may transfer to a next state in the direction of Arrow 207. Every state has two transferable states decided by Row 203. The Viterbi decoder restores the data of Row 203 by means of the branch metric 101.

Since every state comes from two previous states, there are two repeated statuses. The shape of the bold lines in FIG. 2 looks like a butterfly. The branch metric 101 basically consists of many butterfly-like patterns. FIG. 3 shows a butterfly pattern 209. Either State 301 or State 303 is the current state of the encoder. States 305 and 307 are next possible states. Both States 301 and 303 might transfer to States 305 and 307. The current input to the encoder decides the next state going to be State 305 or state 307. For example, if the current state is Sate 301, it follows the transition direction 302 toward State 305 when the input is 0, and, otherwise, it follows transition direction 304 toward State 307 when the input is 1.

FIG. 4 is a block diagram of BMU. As shown in FIG. 4, BMU includes two circuitries: one is a branch metric generator BMG and the other is a branch metric calculator BMC. BMG includes two outputs, ref_bit_0 and ref_bit_1, to provide every route's ideal data values. BMC calculates the difference between received signals, rec_bit_0 and rec_bit_1, and ideal data values, ref bit_0 and ref bit_1, and then transmits the difference toward PMU in FIG. 1. During data transmission, one usually divides data into positive and negative portions, e.g. a 7-bit data can be divided into (1~64) and (-1~-64). When the outputs, ref_bit_0 and ref_bit_1, of BMG are all 0, it means the received signals, rec_bit_0 and rec_bit_1, should be within (1~64). When the outputs, ref_bit_0 and ref_bit_1, of BMG are all 1, it means the received signals, rec_bit_0 and rec_bit_1, should be within (-1~-64). For example, if {rec_bit_0, rec_bit_1}={24, -55} and {ref_bit_0, ref_bit_1}={0,0}, one can realize that rec_bit_0=24 is correct but rec_bit_1=-55 is wrong. Therefore, the outputs of BMU modify {rec_bit_0, rec_bit_1}={24, -55} to {out_bit _0, out_bit_1}={0,55}. After that, one chooses a shorter route as the correct decoding route.

In order to determine if the received data is correct, the prior art decoders store ideal data values in BMG in advance to compare with the received data. However, the method of the prior art needs at least an adder and a memory built in BMG, and moreover needs a circuit to generate addresses pointing to the memory. Such arrangement not only limits the speed of decoders but also increases layout area of the circuit. Besides, BMG is designed to be able to generate many sets of branch metrics for different systems. FIG. 5 illustrates a ½ rate BMG of the prior art, which decides a branch metric by an input sel_in. Such structure requires several multiplexers to select the branch metric and, as mentioned above, enlarges its physical size that results in higher manufacturing cost.

SUMMARY OF THE INVENTION

One aspect of the present invention is to provide a branch metric generator for a Viterbi decoder to generate a branch metric with butterfly patterns.

Another aspect of the present invention is to provide a branch metric generator for a Viterbi decoder which can perform high speed decoding and error correction, with reduced layout area and also lower overall cost. The generator can be applied in WCDMA, wireless LAN and digital communication systems.

In order to achieve the aspects set forth, a branch metric generator for Viterbi decoder in accordance with the present invention includes a linear feedback shift register and a convolutional encoder. The linear feedback shift register carries out a specific primitive characteristic polynomial calculation to generate a number sequence. The convolutional encoder encodes the number sequence properly in order to output a branch metric with butterfly patterns.

DETAILED DESCRIPTION

Figure 1:
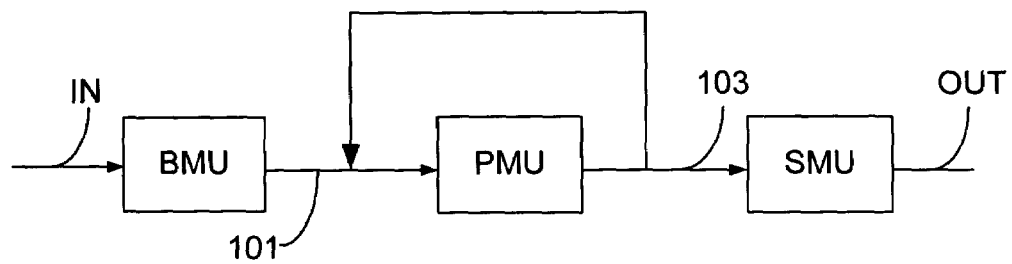
FIG. 1 is a block diagram of a Viterbi decoder.
Figure 3:
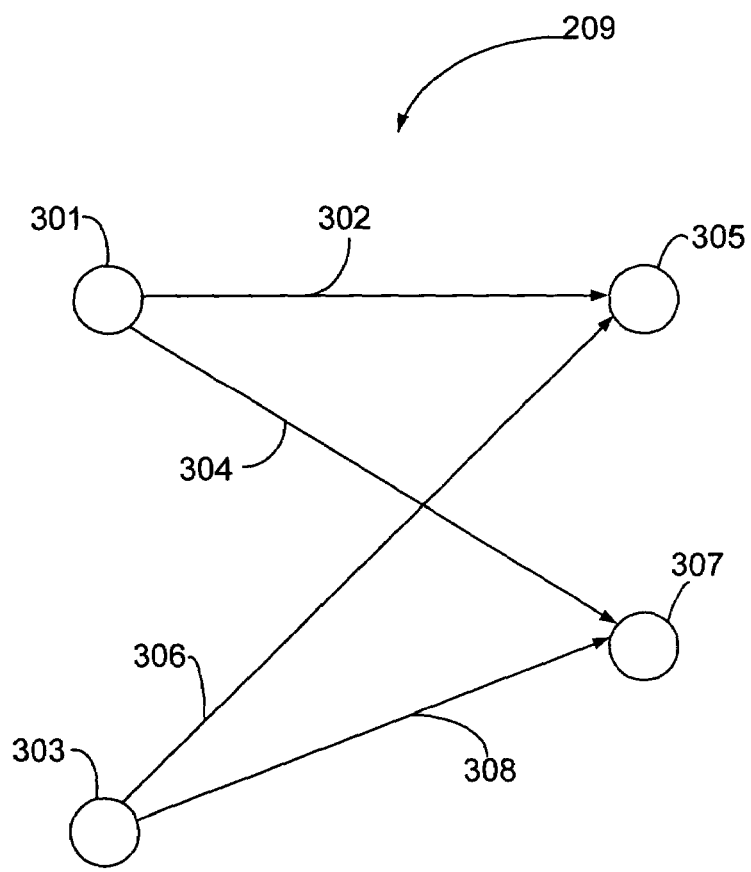
FIG. 3 is a butterfly pattern chart.
Figure 2:
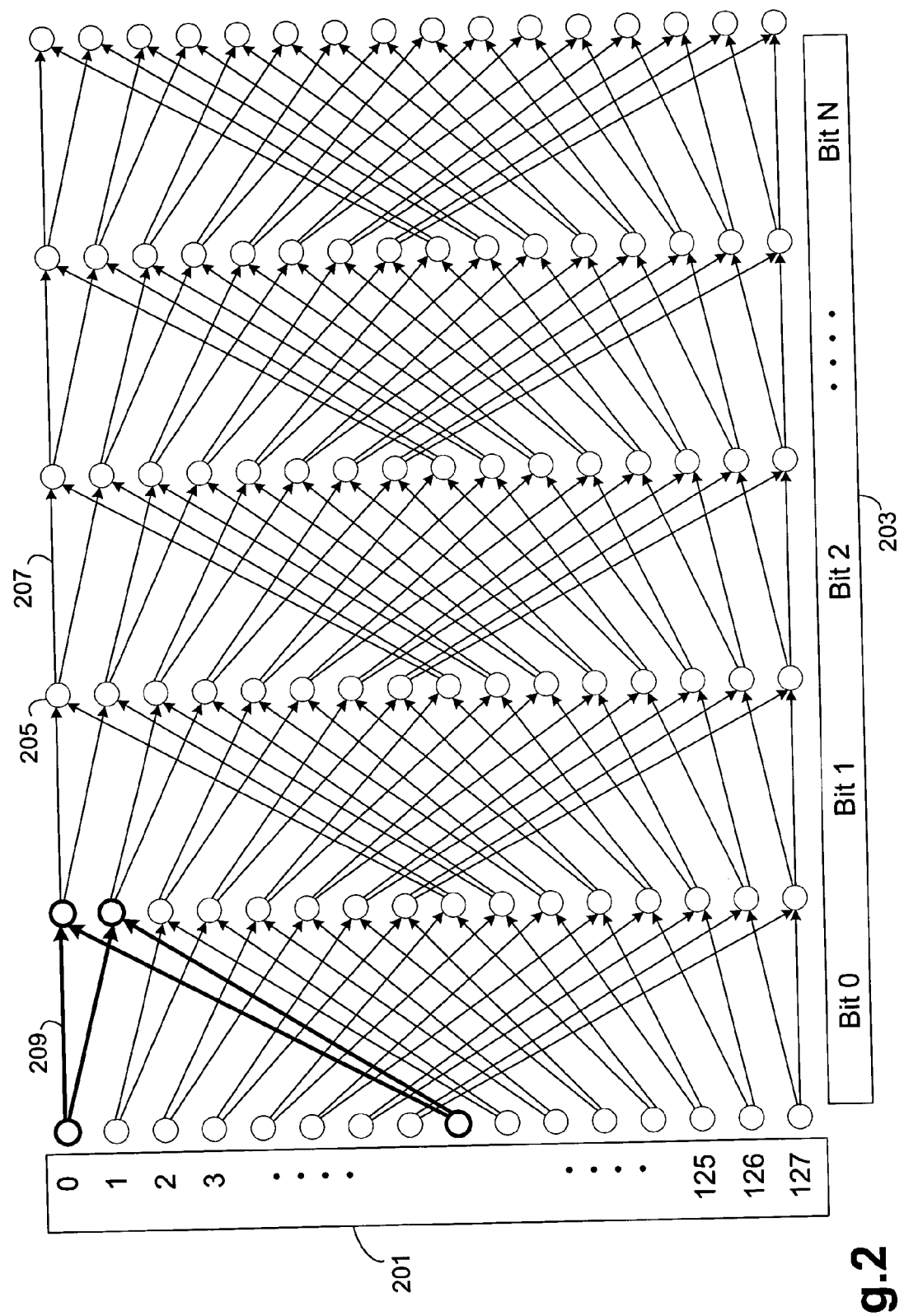
FIG. 2 is a trellis diagram of a branch metric.
Figure 4:
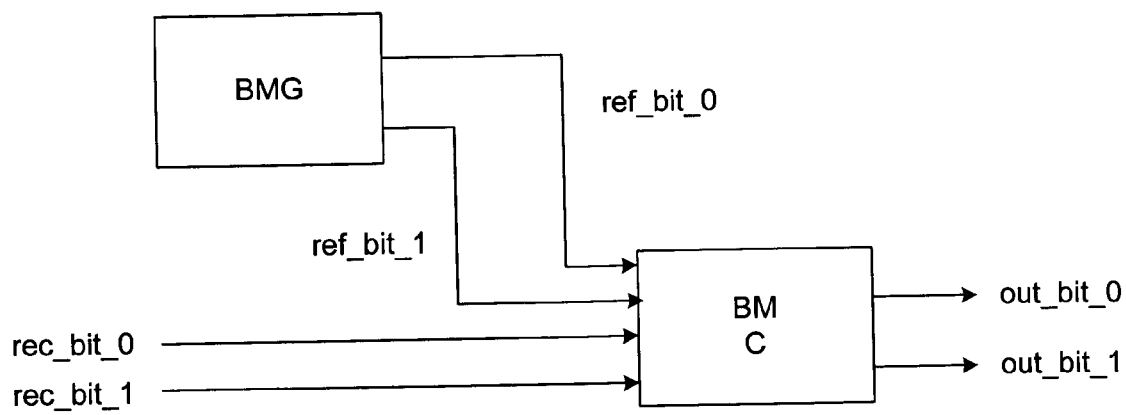
FIG. 4 is a block diagram of a branch metric generation unit.
Figure 6:
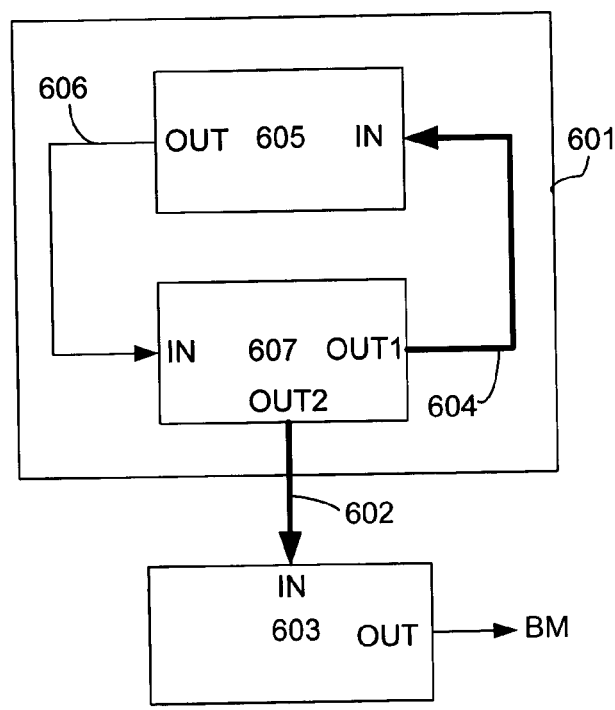
FIG. 6 is a block diagram of a first embodiment of the present invention.
Figure 5:
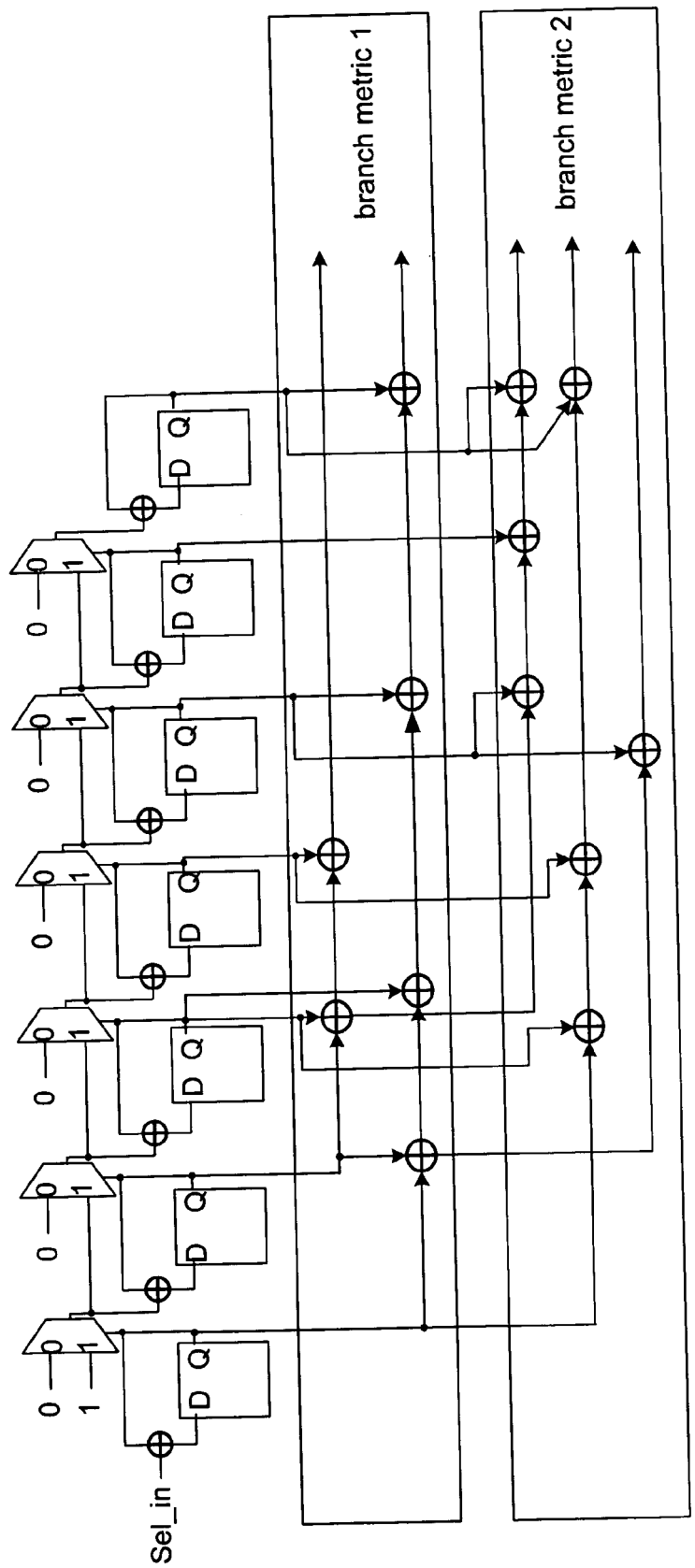
FIG. 5 is a circuit diagram of a generator generating two different branch metrics in accordance with the prior art.

The present invention provides a branch metric generator to generate a branch metric with butterfly patterns performing a comparison calculation with received signals in order to assure correctness of the received signals. FIG. 6 is a block diagram of an embodiment of the present invention. The structure includes a linear feedback shift register 601 and a convolutional encoder 603. The linear feedback shift register 601 performs a specific primitive characteristic polynomial calculation according to system requirement and generates a number sequence 602. The convolutional encoder 603 encodes the number sequence 602 properly and then outputs a branch metric BM with butterfly patterns. The bold arrows in FIG. 6 indicate the transmission includes at least two-bit data.

The linear feedback shift register 601 further includes a number sequence generation circuit 607 and a performing circuit 605. The number sequence generation circuit 607 generates a binary number 604 and outputs it to the performing circuit 605. The performing circuit 605 includes a specific primitive characteristic polynomial calculation, which may be a polynomial division. After the binary number 604 goes through the calculation in the performing circuit 605, a result 606 is transmitted to the number sequence generation circuit 607 to generate a next binary number 604. Such iteration forms the number sequence 602. As shown in FIG. 6, a first output end OUT1 of the number sequence generation circuit 607 is connected to a data input end IN of the performing circuit 605. A data output end OUT of the performing circuit 605 is connected to an input end IN of the number sequence generation circuit 607. A second output end OUT2 of the number sequence generation circuit 607 is connected to an input end IN of the convolutional encoder 603. The branch metric BM, through an output end OUT of the convolutional decoder 603, is transmitted to the next stage, the branch metric calculator BMC.

Figure 7:
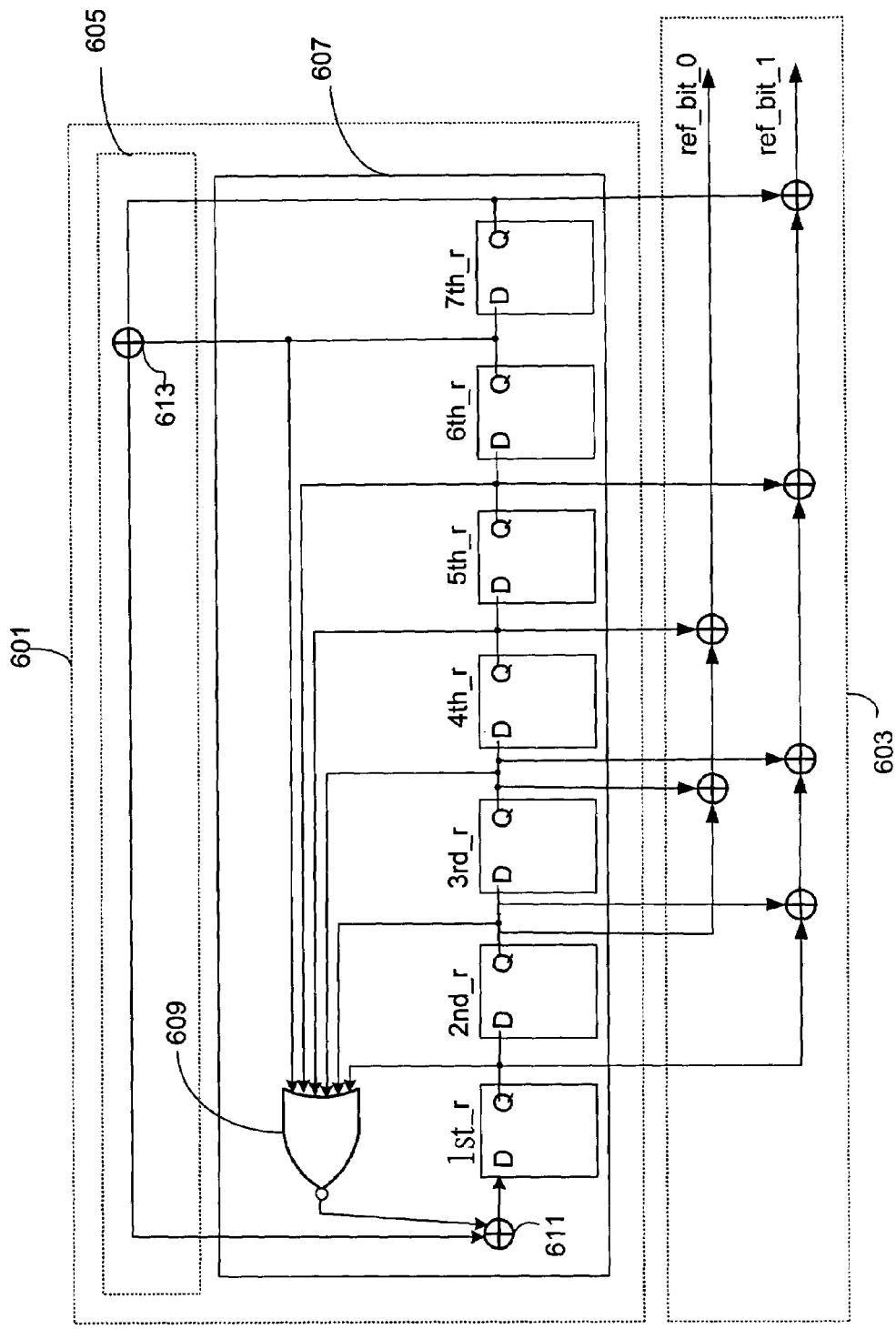
FIG. 7 is a circuit diagram of the first embodiment of the present invention.

FIG. 7 illustrates a circuitry of the embodiment shown in FIG. 6. This circuit is applied to those systems which comply with the third-generation partnership project (3GPP) regulations. According to the regulations, the constraint length k of the embodiment is equal to 9, which means that the number sequence generation circuit 607 needs 7 registers: $1^{st}\_r, 2^{nd}\_r \ldots 7^{th}\_r$ and an XOR gate 611. However, the 7 registers and the XOR gate 611 can only generate $2^7-1$ binary numbers 604 forming a number sequence. A NOR gate 609 must be included to generate $2^7$ binary numbers 604 forming a number sequence. The registers $1^{st}\_r, 2^{nd}\_r \ldots 7^{th}\_r$ can, but are not limited to, use of D Flip-Flops. Any other type Flip-Flops or similar circuits are available herein.

The performing circuit 605 includes calculation of a specific primitive characteristic polynomial: $X^7+X+1$. In order to perform the calculation, the first output end OUT1 of the number sequence generation circuit 607 should also include the outputs of 6th_r and 7th_r. Moreover, the performing circuit 605 should also include an XOR gate 613 whose input is connected to the data input end IN of the performing circuit 605 and whose output is connected to the data output end OUT of the performing circuit 605.

According to the regulations of 3GPP, the convolutional encoder 603, connected to the linear feedback shift register 601, includes several XOR gates, and the interconnections are shown in FIG. 7. The convolutional encoder 603 can generate binary branch metric outputs, ref_bit_0 and ref_bit_1. The outputs, ref_bit_0, and ref_bit_1, can be a reference to determine if received signals are correct or not.

Figure 8:
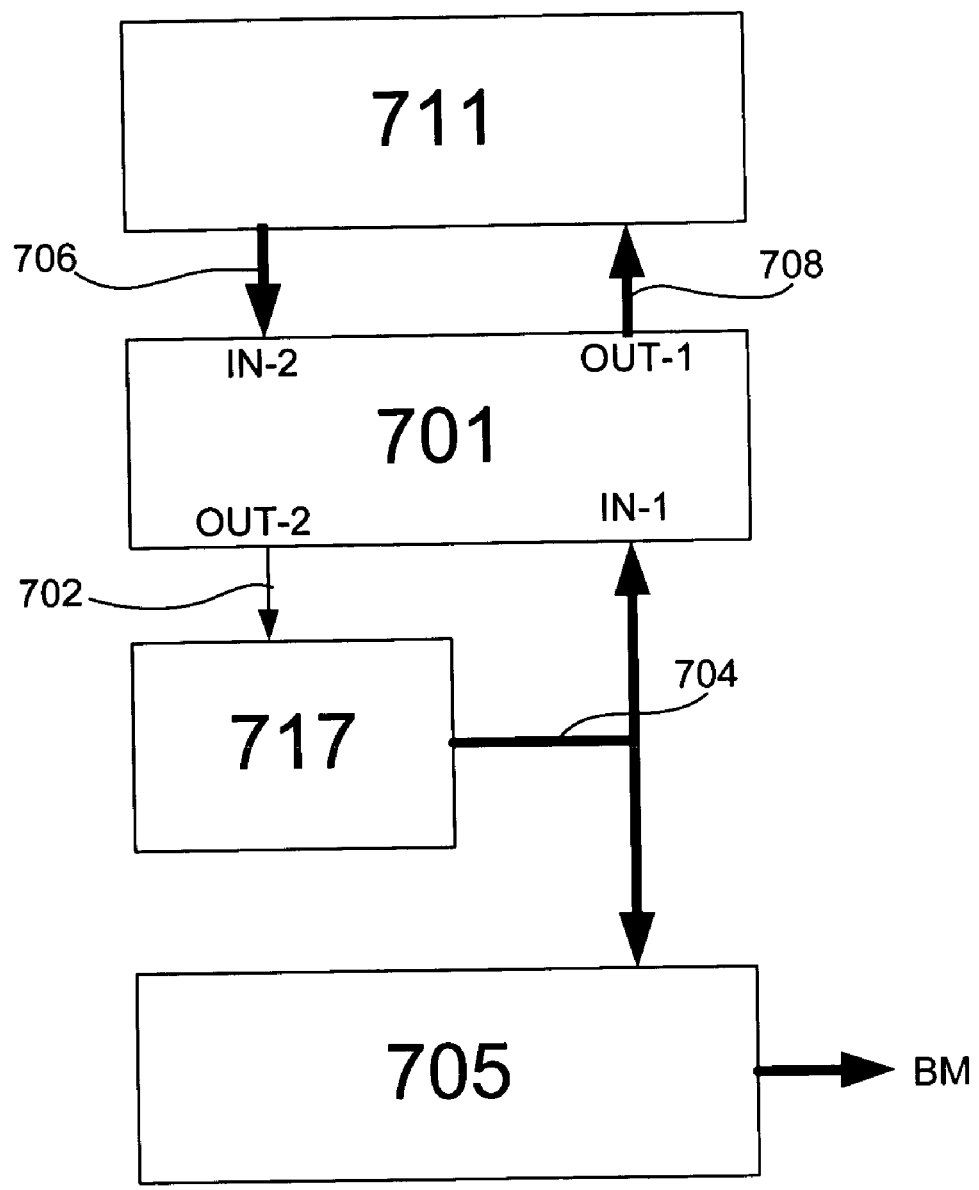
FIG. 8 is a block diagram of a second embodiment of the present invention.

Different transmission speed or different transmission bits are used to match various data quality requirements; therefore, different primitive characteristic polynomials are sometimes required to build in a branch metric generator. A second embodiment of the present invention is another branch metric generator of this case. It selects one of the primitive characteristic polynomials to generate a branch metric with butterfly patterns through a selection signal. As shown in FIG. 8, a branch metric generator, being capable of selecting one from several primitive characteristic polynomials, includes a selector 701, a performing circuit set 711, a number sequence generation circuit 717 and a convolutional encoder 705. The selector 701 selects one of the calculation results 706 respectively derived from the primitive characteristic polynomials to generate a specific result 702. The performing circuit set 711 includes a plurality of performing circuits. Each of the performing circuits represents one of the primitive characteristic polynomials. The calculation results 706 are transmitted to the selector 701 to be selected. The function of the number sequence generation circuit 717 is the same as that of the number sequence generation circuit 607 shown in FIG. 7. Basically, they are composed of a plurality of registers. The convolutional encoder 705 encodes a number sequence 704 generated by the number sequence generation circuit 717 into a branch metric BM with butterfly patterns. The bold arrows in FIG. 8 show at least two-bit data transmitted.

Figure 9:
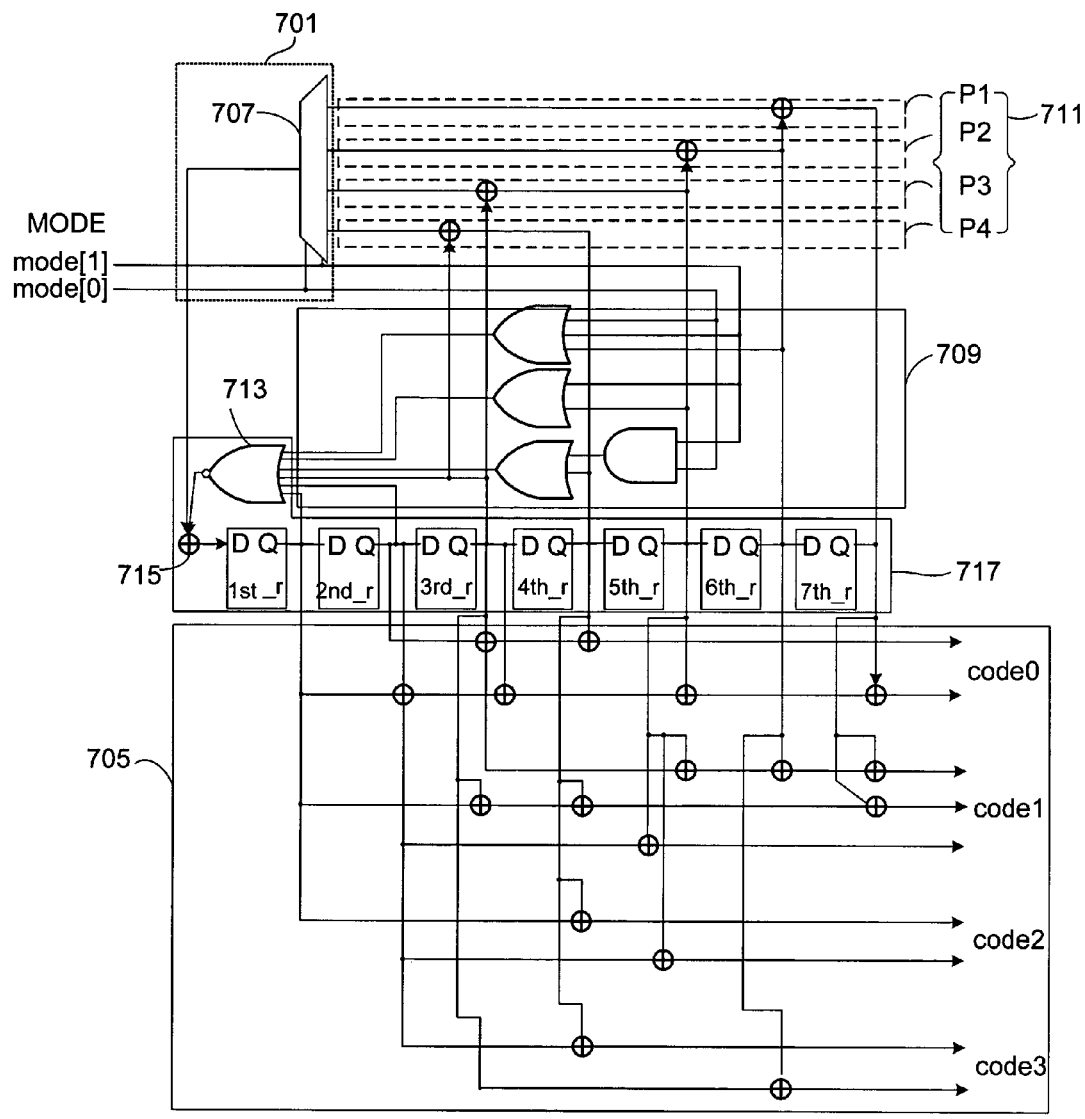
FIG. 9 is a circuit diagram of the second embodiment of the present invention.

FIG. 9 is the circuitry of FIG. 8. The selector 701 includes a selection input end MODE, a plurality of select logic gates 709 and a multiplexer 707. The selection input end MODE is configured to input a selection signal. When the selection signal is 2 bits, the signal can be (0,0), (0,1), (1,0) and (1,1). In addition to controlling the select output of the multiplexer 707, the selection signal can select the number sequence 704 generated by the number sequence generation circuit 717, through a plurality of select logic gates 709, to generate a result 708 inputted to the performing circuit set 711. In this embodiment, one of four primitive characteristic polynomials can be selected, and the selection signal is 2 bits to respectively select four different calculation results 706. The multiplexer 707 selects a performing circuit based on the selection signal. One selected performing circuit represents a specific primitive characteristic polynomial. The present invention is not limited to multiplexers. On the contrary, any circuit having similar functions is available herein.

The number sequence 704, generated by the number sequence generation circuit 717, is inputted to the convolutional encoder 705 and the select logic gates 709 respectively. The performing circuit set 711 includes four primitive characteristic polynomials. The calculation results 706 of the four primitive characteristic polynomials are inputted into the multiplexer 707. The multiplexer 707 selects one result based on the selection signal, and the selected result as well as the output of the NOR gate 713 are inputted to the XOR gate 715. The output signal of the XOR gate 715 is transmitted to the number sequence generation circuit 717. It is noted that the selection signal respectively controls the multiplexer 707 and the select logic gates 709 to select a specific primitive characteristic polynomial for calculation.

The performing circuit set 711 in FIG. 9 includes four primitive characteristic polynomials: $P1=X^7+X+1$, $P2=X^6+X+1$, $P3=X^5+X^2+1$ and $P4=X_4+X+1$. The calculation of each primitive characteristic polynomial carries out via XOR gates. The number sequence generation circuit 717 includes 7 registers: $1^{st}\_r, 2^{nd}\_r \ldots 7^{th}\_r$, accomplished with D Flip-Flops. However, the present invention is not limited to D Flip-Flops only. Any other type Flip-Flops or any circuit having similar functions will do. The convolutional encoder 705, according to 3GPP's regulation, includes several XOR gates whose interconnections are shown in FIG. 9. The convolutional encoder 705, a ¼ rate encoder, generates four different branch metrics: code0, code1, code2 and code3. In other words, the four different branch metrics generated from four different primitive characteristic polynomials can apply to four different systems by controlling the select input selection signals: mode[0] and mode[1].

Based on above description, the present invention is capable of applying to different systems with setting the selection signal to determine one specific primitive characteristic polynomial to generate a specific branch metric. Though the embodiment in FIG. 9 includes four primitive characteristic polynomials, those skilled in the art appreciate that other branch metric generators, now known or hereafter developed, are considered within the scope of the invention, based on the teachings set forth herein. Moreover, the layout area of the present invention is much smaller than that of the prior art.

I claim:

1. A generator of a Viterbi decoder for generating a branch metric, comprising:
    a linear feedback shift register for performing calculation on a specific primitive characteristic polynomial to generate a number sequence; and
    a convolutional encoder, connected to the linear feedback shift register, for receiving and encoding the number sequence to generate the branch metric.

2. The generator of claim 1, wherein the linear feedback shift register comprises:
    a number sequence generation circuit comprising an input end, a first output end and a second output end; and
    a performing circuit, comprising a data input end and a data output end, used to perform calculation on the specific primitive characteristic polynomial;
    wherein the first output end is connected to the data input end, the data output end is connected to the input end, and the second output end is connected to the convolutional encoder.

3. The generator of claim 2, wherein the number sequence generation circuit comprises:
    N registers;
    a NOR gate; and
    an XOR gate;
    wherein the number sequence generation circuit generates $2^N$ binary numbers.

4. The generator of claim 3, wherein each of the N registers comprises a D flip-flop.

5. The generator of claim 2, wherein the performing circuit comprises at least an XOR gate.

6. The generator of claim 3, wherein the convolutional encoder comprises at least an XOR gate.

7. A generator of a Viterbi decoder for generating a branch metric by selecting one of a plurality of primitive characteristic polynomials, comprising:
    a selector;
    a performing circuit set comprising a plurality of performing circuits, each of the plurality of performing circuits corresponding to one of the plurality of primitive characteristic polynomials, the performing circuit set outputting a plurality of calculation results to the selector;
    a number sequence generation circuit, connected to the selector, for providing a number sequence to the selector; and
    a convolutional encoder, connected to the number sequence generation circuit, for receiving the number sequence;
    wherein the selector selects and returns one of the plurality of calculation results to the number sequence generation circuit, and the convolutional encoder encodes the number sequence to generate the branch metric.

8. The generator of claim 7, wherein the selector comprises:
    a selection input end for inputting a selection signal;
    a multiplexer for receiving the plurality of calculation results and the selection signal; and
    a select logic gate for receiving the selection signal.

9. The generator of claim 7, wherein the number sequence generation circuit comprises:
    N registers;
    a NOR gate; and
    an XOR gate;
    wherein the number sequence generation circuit generates $2^N$ binary numbers.

10. The generator of claim 9, wherein each of the N registers comprises a D flip-flop.

11. The generator of claim 7, wherein the performing circuit comprises at least an XOR gate.

12. The generator of claim 7, wherein the convolutional encoder comprises at least an XOR gate.

* * * * *